(12) United States Patent
Imai et al.

(10) Patent No.: US 7,675,755 B2
(45) Date of Patent: Mar. 9, 2010

(54) LED MODULE

(75) Inventors: Noboru Imai, Takahagi (JP); Shuichi Nakazawa, Hitachi (JP); Aki Suzuki, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 11/930,485

(22) Filed: Oct. 31, 2007

(65) Prior Publication Data
US 2008/0101071 A1  May 1, 2008

(30) Foreign Application Priority Data
Oct. 31, 2006 (JP) .............................. 2006-295294
Jun. 11, 2007 (JP) .............................. 2007-154236

(51) Int. Cl.
*H05K 7/00* (2006.01)
(52) U.S. Cl. ..................................... 361/760; 360/761
(58) Field of Classification Search .................. 361/760, 361/761
See application file for complete search history.

(56) References Cited
U.S. PATENT DOCUMENTS
6,831,294 B1 * 12/2004 Nishimura et al. ............ 257/48

2004/0120151 A1 * 6/2004 Ostler et al. ................. 362/294

FOREIGN PATENT DOCUMENTS
JP 11-340514 12/1999
JP 2003-110148 4/2003
JP 2006-086139 3/2006

* cited by examiner

*Primary Examiner*—Dean A. Reichard
*Assistant Examiner*—Abiy Getachew
(74) *Attorney, Agent, or Firm*—Antonelli, Terry, Stout & Kraus, LLP.

(57) ABSTRACT

An LED module comprises: an LED element having an electrode for flip chip mounting; a wiring board having at least two metal layers and an electrically insulating layer including a polymer resin and being interposed between each two of the metal layers; and a metal film layer of the LED element for conducting heat from the LED element. A first metal layer of the at least two metal layers has a power supply metal pattern and a heat transfer metal pattern that are formed electrically insulated from each other. The power supply metal pattern and the electrode are connected to each other; the heat transfer metal pattern and the metal film layer are connected through an electrically insulating portion interposed therebetween; and the heat transfer metal pattern and the metal layers other than the first metal layer are coupled to each other through a heat transfer portion.

13 Claims, 7 Drawing Sheets

LED MODULE

CLAIM OF PRIORITY

The present application claims priority from Japanese application serial no. 2007-154236 filed on Jun. 11, 2007, which claims priority from Japanese patent application serial no. 2006-295294 filed on Oct. 31, 2006, the contents of which are hereby incorporated by reference into this application.

BACKGROUND OF THE INVENTION

1. Field of the Invention

The present invention relates to LED modules in which LED (Light Emitting Diode) elements are mounted on a wiring board.

2. Description of Related Art

LED modules combine LED elements or LEDs (packaged LED elements for mounting) with wires for powering them, a wiring board, etc. A simple example of the LED module is one for illumination use that combines LEDs interconnected by general-purpose wires with a controller for turning on and off the LEDs.

In recent years, the luminous efficiency of LEDs has been improved and blue LEDs have been developed; therefore it has become possible to produce white light by using a blue LED with a phosphor, or by combining red, green and blue LEDs. Hence, these white light sources are widely used as a backlight of a small-size FPD (Flat Panel Display) for use in a cellular phone and the like. In addition, such LED technologies have been further improved to the point where LEDs can also replace fluorescent lamps conventionally used for a backlight of liquid crystal displays or a lighting device, and such applications have been put to commercial use.

The following are important points to consider when using LEDs for such applications: (1) light emitted in an LED element is efficiently utilized; (2) heat generated from an LED element is efficiently dissipated to restrain the LED element from elevating temperature; (3) an LED element can be performance tested; etc.

As a solution to the above point (1), a flip chip mountable LED element is proposed (e.g., JP-A Hei 11(1999)-340514). As a solution to the above point (2), there is a method in which an electrical insulator with a good thermal conductivity is used as a submount to increase heat conduction area (e.g., JP-A-2006-86139). A solution to the above point (3) can be provided by commercially available LEDs which are packaged to be mountable on a wiring board or the above-mentioned submount. Further, as a solution to both the above points (1) and (2), an LED element is proposed which is flip chip mountable and has electrically insulating bumps for heat dissipation (e.g., JP-A-2003-110148).

Most of the conventional mountings of LEDs use a submount in which a power supply metal wiring pattern is formed by a vapor growth method or the like on the surface of an electrically insulating ceramic with a good thermal conductivity such as aluminum nitride. However, the submount is a separate component from the wiring board for powering it, resulting in an increase in the number of constituent components of an LED module. In addition, such the electrically insulating ceramic materials are expensive and the manufacturing cost of forming the wiring on the submount surface using the vapor growth method is also high. And, all these factors have been an obstacle to cost reduction of LED modules.

Meanwhile, without using such the ceramic materials, it is difficult to provide both heat conduction and electrical insulation by, for example, bonding a heat dissipation plate to an LED module in which a wiring board and LED elements are directly flip chip connected to each other, since most of the electrically insulating materials used in wiring boards have a low thermal conductivity. For example, the thermal conductivity of electrically insulating polyimide is only 0.25 W/m·K compared with 398 W/m·K of electrically conductive copper.

Furthermore, there is another problem in that, when such a flip chip mounted module is subjected to a temperature cycle, a stress is induced, in and at its contacted surface of a connecting member such as a solder ball, by thermal expansion difference between an LED element and wiring board, which may destroy the LED element, or damage the connection member or its contacted surface.

SUMMARY OF THE INVENTION

Under these circumstances, it is an object of the present invention to provide an LED module capable of addressing the above problems and improving heat dissipating properties.

(1) According to one aspect of the present invention, an LED module comprises an LED element having an electrode for flip chip mounting the LED element; a wiring board having at least two metal layers and an electrically insulating layer including a polymer resin and being interposed between each two of the at least two metal layers; and a metal film layer of the LED element for conducting heat from the LED element, in which a first metal layer of the at least two metal layers on the LED element mounted side of the wiring board has a power supply metal pattern and a heat transfer metal pattern formed electrically insulated from the power supply metal pattern; and in which the power supply metal pattern and the electrode are flip chip connected to each other for enabling electrical conduction; the heat transfer metal pattern and the metal film layer are flip chip connected through an electrically insulating portion interposed therebetween; and the heat transfer metal pattern and the at least two metal layers other than the first metal layer are coupled to each other through a heat transfer portion.

In the above invention (1), the following modifications and changes can be made.

(i) A heat transfer metal portion is formed on the metal film layer; and the LED element is flip chip connected to the heat transfer metal pattern through the heat transfer metal portion and the electrically insulating portion.

(ii) A plurality of openings are formed in a resist covering the first metal layer; and the electrode and the heat transfer metal portion are each flip chip connected through a corresponding one of the plurality of openings to the power supply metal pattern and the heat transfer metal pattern respectively.

(iii) The wiring board has a tape-shape or a sheet-shape; and the LED module comprises at least two LED elements that are disposed in width and/or length directions of the wiring board at a respective given spacing for each direction.

(iv) The heat transfer portion is formed of a material having a thermal conductivity of not less than 30 W/m·K.

(v) The heat transfer portion is at least one plated and filled via.

(vi) The electrically insulating layer has a thickness within a range from 3 to 125 μm.

(vii) The polymer resin has a linear thermal expansion coefficient of 0 to 6 ppm/°C. within a temperature range from −40 to +120°C.

(viii) The polymer resin has a storage modulus of not more than 100 MPa and not less than 1 MPa at 100° C. and 240° C. respectively (dynamic viscoelasticity measurement frequency: 1 Hz).

(ix) A heat dissipator is provided on an outer metal layer which is connected to the heat transfer metal pattern by the heat transfer portion, and is formed on the electrically insulating layer on the side opposite to the first metal layer.

(x) The heat dissipator has a thermal conductivity of not less than 30 W/m·K.

(xi) The heat dissipator is made of a ceramic.

Advantages of the Invention

The present invention provides an LED module that can be manufactured without a submount, resulting in a decrease in the number of constituent components and the cost of the LED module. Furthermore, the present invention provides an LED module which has excellent heat dissipating properties.

DETAILED DESCRIPTION OF THE PREFERRED EMBODIMENTS

Figure 1:
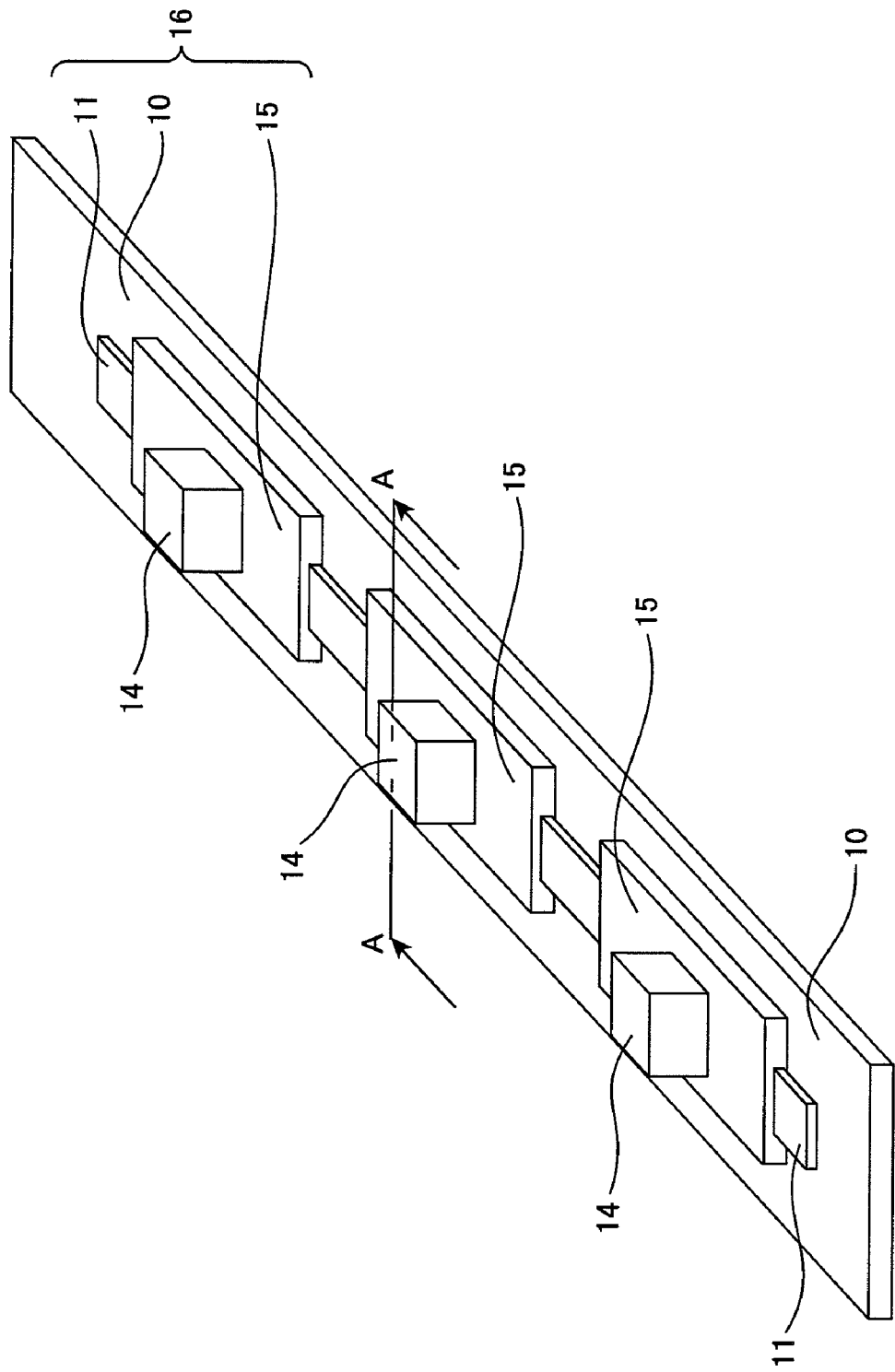
FIG. 1 is a schematic illustration showing a perspective view of an example of an LED module according to a first embodiment of the present invention.

Preferred embodiments of an LED module according to the present invention will be described hereinafter.

The LED module comprises: an LED element having an electrode for flip chip mounting the LED element; a wiring board having at least two metal layers and an electrically insulating layer including a polymer resin and being interposed between each two of the at least two metal layers; and a metal film layer of the LED element for conducting heat from the LED element, in which a first metal layer of the at least two metal layers on the LED element mounted side of the wiring board has a power supply metal pattern and a heat transfer metal pattern formed electrically insulated from the power supply metal pattern; and in which the power supply metal pattern and the electrode are flip chip connected to each other for enabling electrical conduction; the heat transfer metal pattern and the metal film layer are flip chip connected through an electrically insulating portion interposed therebetween; and the heat transfer metal pattern and the at least two metal layers other than the first metal layer are coupled to each other through a heat transfer portion. Heat generated at the LED element is transferred, through the metal film layer of the LED element and the flip chip connection portion having the electrically insulating portion, to the heat transfer metal pattern, and is further transferred through the heat transfer portion to the metal layer other than the first metal layer.

Thus, the heat generated at the LED element can be transferred and spread successively in cascade to the heat transfer metal pattern and then to the metal layer, thereby obtaining excellent heat dissipation, and as a result brightness of the LED module can be enhanced by increasing current applied thereto. Additionally, the LED element is flip chip mounted directly on the wiring board, thereby eliminating use of submounts and providing low cost manufacturing.

Preferably, a heat transfer metal portion is formed on the metal film layer, and the LED element is flip chip connected to the heat transfer metal pattern with the heat transfer metal portion and electrically insulating portion interposed therebetween. The heat transfer metal portion can be formed on the metal film layer, for example, simultaneously with forming the electrode on the LED element.

Also preferably, openings are formed in a resist covering the first metal layer, and the electrode and heat transfer metal portion are flip chip connected through the openings to the power supply and heat transfer metal patterns, respectively.

In addition, the LED module may have a configuration that has a tape or sheet wiring board on which two or more LED elements are disposed in the width and/or length directions. This can reduce the manufacturing cost as well as provide optimum pattern design of an LED module, for example, by positioning a plurality of LED elements in a desired arrangement.

Polymer resins usable for the electrically insulating layer of the wiring board include polyimide, polyetherimide, polyamide-imide, polyimidebenzoxazole, epoxy, aramid, and any mixture thereof. Further, these resins and mixtures may be combined with a rubber or a filler (such as a reinforcer and viscosity modifier) to form the electrically insulating layer. The electrically insulating layer preferably has a thickness of not less than 3 μm, considering that the electrically insulating layer of these resins has a dielectric strength of in the range of 100 to 200 V/μm. On the other hand, in order to secure a sufficient heat conduction in the thickness direction of the polymer resin, i.e., in the direction from the power supply metal pattern (power supply wiring) to another metal layer of the at least two metal layers, the thickness of the electrically insulating layer should be not more than 125 μm and preferably as thin as possible.

In order to reduce stress developed between the LED element and the electrically insulating layer, the linear thermal expansion coefficient of the electrically insulating layer is preferably 0 to 6 ppm/° C., and is ideally in the same range as that of the LED element within the temperature range of −40 to +120° C., and thereby reliability of the LED module can be improved even under temperature cycle environments.

In another respect, the polymer resin contained in the electrically insulating layer preferably has a storage modulus of not more than 100 MPa and not less than 1 MPa at 100 and 240° C. respectively (dynamic viscoelasticity measurement frequency: 1 Hz). Use of such the polymer resin with a small elastic modulus for the electrically insulating layer of the wiring board can reduce stress caused by thermal expansion difference between the LED element and wiring board, and therefore reliability can be improved under temperature cycle environments. Further, the polymer resin has a sufficient storage modulus of not less than 1 MPa even at a reflow temperature of around 240° C. at which solder melts when mounting the LED element on the wiring board, thereby preventing facture in, and at the bonded interface of, the polymer resin.

Additionally, in order to compensate for the small contact area of the heat transfer portion which connects the heat transfer metal pattern to the metal layer other than the first metal layer, it is particularly preferable that the heat transfer portion ensures a high thermal conductivity, e.g., 398 W/m·K by using copper plating. Also, it may preferably have a thermal conductivity of not less than 30 W/m·K and thus comparable to that of Pb free solders. A thermal conductivity of 30 W/m·K is about 100 times higher than that of polyimides.

Further, the heat transfer portion may be configured with at least one plated and filled via, and the diameter φ of the via is preferably not more than 100 μm. In particular, a small via (especially a through hole via) having a diameter φ of not more than 60 μm can be plated and filled simultaneously with plating both sides of the wiring board to a thickness of not less than the radius of the via. Therefore, it enables quality of the through via to be assured and manufacturing cost of the wiring board to be reduced.

The electrically insulating portion between the metal film layer of the LED element and the heat transfer metal pattern is preferably provided on the side of the LED element in terms of manufacturing cost, but it may be provided on the side of the heat transfer metal pattern, or on either sides. The electrically insulating portion is preferably an electrically insulating film such as $SiO_2$ and DLC (Diamond Like Carbon) formed by a vapor growth method or the like. Furthermore, a good thermal conductive ceramic such as aluminum nitride that is formed in, e.g., a cylindrical or prismatic shape may be sandwiched between the heat transfer metal pattern and the metal film layer, instead of the solder ball. In this case, there is no need of forming any electrically insulating film on the LED element or the heat transfer metal pattern.

In addition, a heat dissipator or a heat radiator may be provided on another metal layer of the at least two metal layers (used for a heat transferring or dissipating metal pattern) which is connected to the heat transfer metal pattern by the heat transfer portion and is formed on the electrically insulating layer on the side opposite to the first metal layer. The heat dissipator (the heat radiator) includes a heat sink and an equipment metal casing, and it can be mounted to the another metal layer of the at least two metal layers (heat transferring or dissipating metal pattern) by, e.g., bonding with an adhesive. The metal layer other than the first metal layer (heat transferring or dissipating metal pattern) does not require any power supply wiring, and as a result the metal layer formation area can be maximized; therefore a general-purpose adhesive having a thermal conductivity of more than about 1 W/m·K can be used as the adhesive for bonding the heat dissipator to the metal layer.

Additionally, the heat dissipator preferably has a thermal conductivity of not less than 30 W/m·K, which is comparable to or more than that of a Pb (lead) free solder.

Use of an electrical conductor such as metal as the heat dissipator may damage the LED element due to an equipment electrical malfunction or the like. In such a case, an electrical insulator such as aluminum oxide (thermal conductivity: approximately 40 W/m·K) and aluminum nitride (thermal conductivity: approximately 300 W/m·K) may be used for the heat dissipator.

Preferred embodiments of the present invention will be further described with reference to the accompanying drawings. However, the present invention is not limited to the embodiments described herein.

First Embodiment of the Invention

FIG. 1 is a schematic illustration showing a perspective view of an example of an LED module according to a first embodiment of the present invention. As shown in FIG. 1, three LED elements 14 are disposed on a tape- or sheet-shape wiring board 16 and serially connected to each other. Although not shown, an encapsulant (such as a transparent resin and an underfilling) or a reflector may be added to the LED element 14 as needed.

Figure 2:
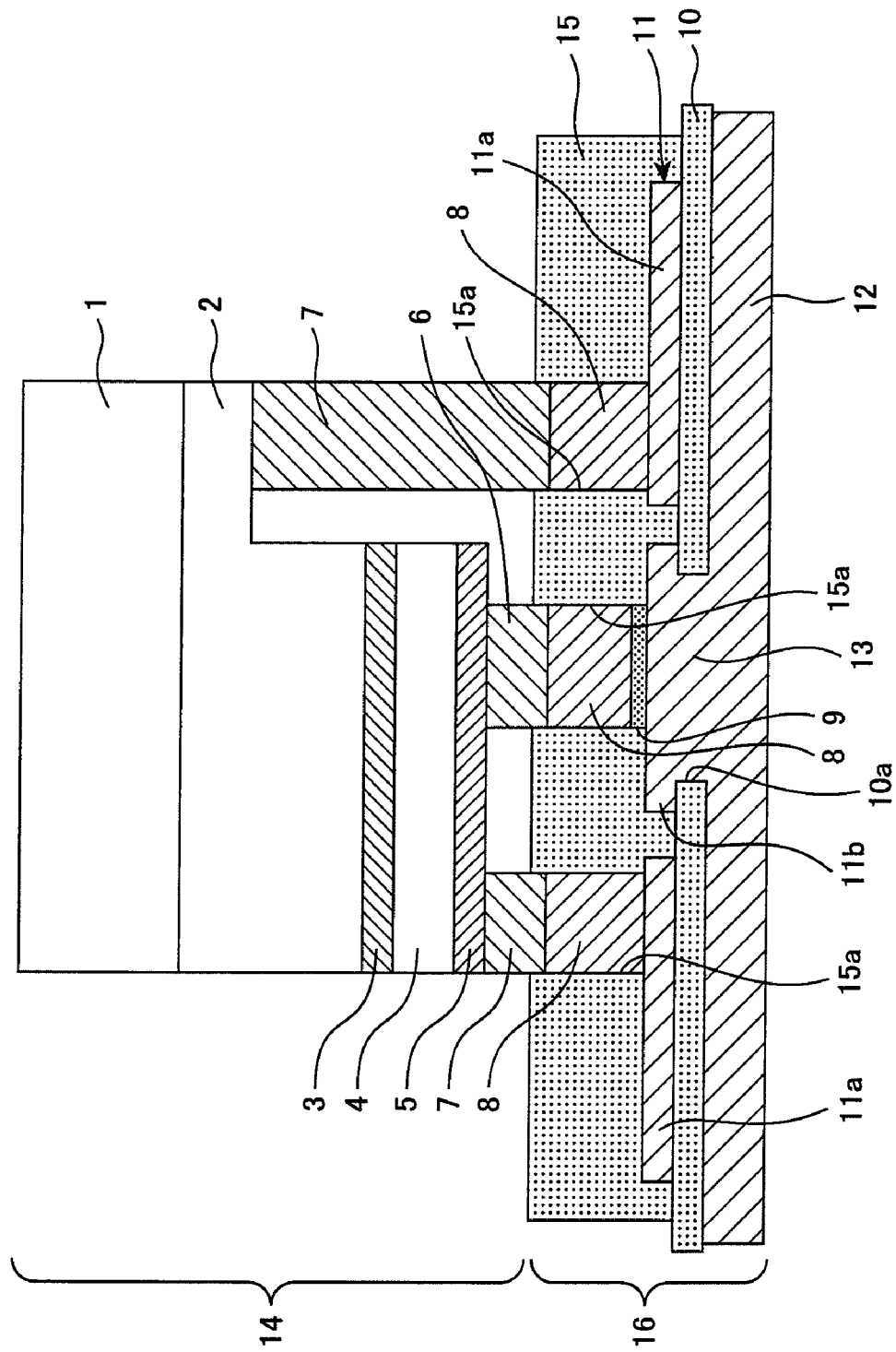
FIG. 2 is a schematic illustration showing a cross sectional view cutting along A-A line in FIG. 1.

FIG. 2 is a schematic illustration showing a cross sectional view cutting along A-A line in FIG. 1. As shown in FIG. 2, the LED element 14 has, on the side of the wiring board 16, two electrodes 7 for flip chip mounting the LED element 14 and at least one heat transfer metal portion 6. The illustrated LED element 14 is fabricated as follows. At first, on a sapphire substrate 1 is formed a stack of an n-type semiconductor layer 2, a light emitting (active) layer 3 and a p-type semiconductor layer 4 each of a group-III nitride semiconductor or the like, and part of the stack is removed by etching. Then, by the vapor deposition method or the like, the electrode 7 (n electrode) is formed on the n-type semiconductor layer 2, while a metal film layer 5 is formed on the p-type semiconductor layer 4 also using vapor deposition method or the like, and thereafter the electrode 7 (p electrode) and the heat transfer metal portion 6 are formed on the metal film layer 5. The metal film layer 5 underlies the electrode 7 (p electrode) and the heat transfer metal portion 6 as well as serves to receive and collect heat generated at the light emitting layer 3. The metal film layer 5 also works to reflect light from the light emitting layer 3 toward the sapphire substrate 1.

The thus obtained LED substrate is divided into chips to provide the LED element 14.

The wiring board 16 has: a polymer resin layer 10 serving as an electrically insulating layer; a first metal layer 11 formed on the LED element 14 mounting side of the polymer resin layer 10; a second metal layer 12 formed on the other side of the polymer resin layer 10; and a resist 15 covering the first metal layer 11. The first metal layer 11 includes: a power supply metal pattern 11a electrically connected to the electrodes 7; and a heat transfer metal pattern 11b formed electrically isolated from the power supply metal pattern 11a. The wiring board 16 may be flexible or rigid.

Resins usable for the polymer resin layer 10 include polyimide, polyetherimide, polyamide-imide, polyimidebenzoxazole, epoxy, aramid. These resins may be used alone or as a mixture, or alternatively rubber or glass cloth may be combined with these single or mixed resins. And, the polymer resin layer 10 is formed in tape- or film-shape.

A preferable material for the first and second metal layers 11 and 12 is copper in terms of thermal and electrical conductivities, but aluminum and copper alloys, etc. may be also used.

When using copper for the heat transfer metal pattern 11b, the inter-layer connection (between the first and second metal layers) is preferably performed using the following method. Firstly, a polyimide film, for example, is prepared as the polymer resin layer 10, and then, by using a laser processing apparatus, a through hole 10a for inter-layer connection with a diameter of 15 to 60 μm is formed simultaneously with forming multiple alignment holes having a diameter of approximately 1 to 2 mm (not shown) which are also used for patterning. Then, using a sputtering apparatus, a corrosion resistant layer and copper sputter layer are applied over the entire surface of resin film including the wall of the through hole 10a. Then, copper is plated over the entire surface using a copper plating machine. When plating of the copper to the resin film with a thickness larger than the radius of the through hole 10a will fill the through hole 10a with the plated copper (plated and filled via 13), a marginal thickness of approximately 5 μm may be added to the plating. Here, although the diameter of the multiple alignment holes (φ 1 to 2 mm) decreases by approximately twice the plating thickness, the center positions of the holes remain unchanged. Hence, by using these alignment holes, required patterns are exposed, developed and etched to form the power supply metal pattern 11a and the heat transfer metal pattern 11b in the first metal layer 11, and further form the second metal layer 12 (a heat transferring or dissipating metal pattern).

When using a semi-additive method, following the above-described copper plating, a required pattern for semi-additive plating is exposed and developed, and then a copper plating is applied to fill the vias (through hole 10a) and form the metal patterns.

In either case, an exposure resist is applied or attached, and is then removed after patterning is completed.

Then, a photosensitive resist 15 is printed (in the case of an ink) or is laminated (in the case of a dry film) followed by exposure and development to form: a desired outline pattern of the resist 15; and openings 15a for flip chip connecting the electrodes 7 of the LED element 14 and the heat transfer metal portion 6 to the wiring board 16. In the case that the diameter of the openings 15a for flip chip connection is as small as not more than 0.1 mm; laser processing is preferred to form the openings. After that, the power supply metal pattern 11a, the heat transfer metal pattern 11b and the second metal layer 12 are plated. The type of the plating may be chosen from a Pd/Ag plating, Ni/Au plating, etc. depending on the purpose. Use of masking technique allows one to choose, for each metal pattern, whether or not any plating is applied and the type of plating applied. For example, the plating may not be applied to the heat transfer metal pattern 11b.

An electrically insulating portion 9 is then formed in the opening 15a for flip chip connection to the heat transfer metal pattern 11b. As the electrically insulating portion 9, an electrically insulating film such as $SiO_2$ and DLC is formed by, e.g., plasma CVD (chemical vapor deposition) to a thickness providing a required insulation (e.g., 1 to 5 μm). When using solder ball for connection of the electrically insulating portion 9 and heat transfer metal portion 6 of the LED element 14 to each other, a solder wettable metal such as gold is preferably formed on the outermost surface of the electrically insulating portion 9.

Then, a solder ball is placed in each opening 15a in the resist 15 and is subsequently reflown to connect the solder ball to the wiring board 16. Thereafter, the heat transfer metal portion 6 and electrodes 7 of the LED element 14 are placed on the solder ball in the opening 15a and another reflow is performed to form a flip chip connection layer 8, thereby completing the electrical and mechanical connection of the LED element 14 to the wiring board 16. The LED element 14 is then encapsulated with resin to complete the fabrication of the LED module. When a reflector needs to be provided to the LED element, it is disposed by bonding or the like before or after the LED element 14 is mounted on the wiring board 16.

Most of the heat generated at the light emitting layer 3 of the LED element 14 is transferred to and collected in the metal film layer 5 of the LED element 14. The collected heat at the metal film layer 5 is transferred to the heat transfer metal pattern 11b through the heat transfer metal portion 6, the flip chip connection layer 8 and the electrically insulating portion 9. And then, the heat is further transferred through the plated and filled via 13 to the second metal layer 12, where the transferred heat is efficiently dissipated.

(Power Supply Metal Pattern and Heat Transfer Metal Pattern)

Figure 3:
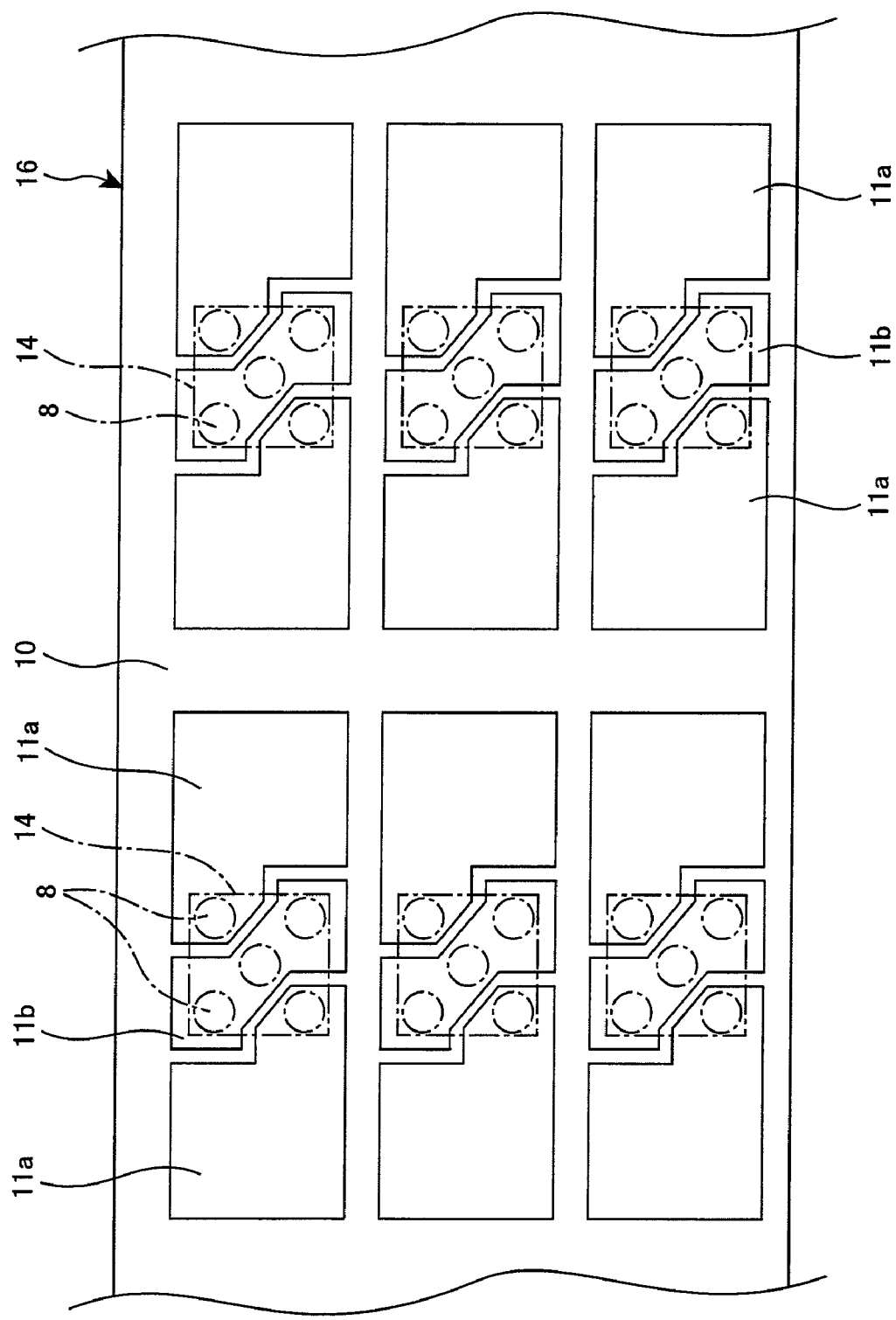
FIG. 3 is a schematic illustration showing a plan view of an example of a first metal layer pattern of a wiring board.

FIG. 3 is a schematic illustration showing a plan view of an example of a first metal layer pattern of the wiring board 16 in which the power supply metal pattern 11a and the heat transfer metal pattern 11b are shown. Here, FIG. 3 illustrates an LED module in which three LED elements 14 are disposed in the width direction of the wiring board 16 while multiple LED elements 14 are disposed in the length direction. In this LED module, each LED element 14 is bonded to the wiring board 16 by five flip chip connection layers 8 consisting of two electrodes 7 and three heat transfer metal portions 6. The power supply metal pattern 11a and the heat transfer metal pattern 11b are separated from each other by space, thus providing electrical insulation. The heat transfer metal pattern 11b is connected to the second metal layer 12 on the backside of the wiring board 16.

There are pluralities of power supply metal patterns 11a each being provided to one corresponding LED element 14, and these patterns are separated by space from each other. This allows each LED element 14 to be individually and independently tested. In addition, if there is a failed LED element in a pass/fail test, it can be repaired before forming a desired circuit by interconnecting the power supply metal patterns 11a using jumpers or the like. Naturally, a patterned interconnection between the power supply metal patterns 11a may be used to provide the interconnection in advance.

Figure 4:
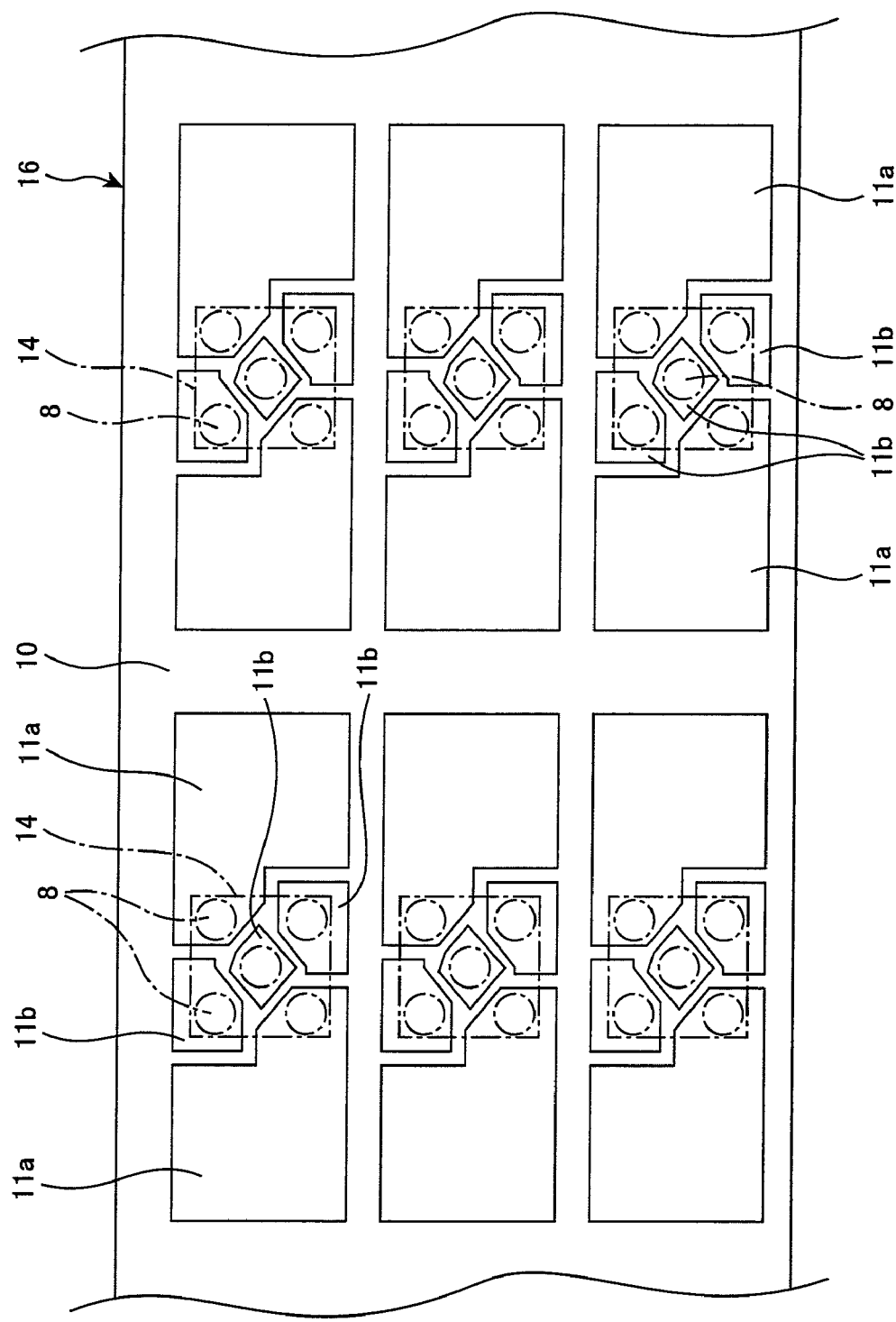
FIG. 4 is a schematic illustration showing a plan view of another example of a first metal layer pattern of a wiring board.

FIG. 4 is a schematic illustration showing a plan view of another example of the first metal layer pattern of the wiring board 16, which further takes temperature cycle resistance into consideration. As the polymer resin layer 10 there is used: a polyimide resin having a thermal expansion coefficient of 0 to 6 ppm/° C. within a temperature range from −40 to +120° C.; or a resin mixture of an epoxy resin and an acrylic rubber having a storage modulus after cure of not more than 100 MPa (dynamic viscoelasticity: measurement temperature of 100° C., measurement frequency of 1 Hz). Furthermore, the power supply metal pattern 11a and the heat transfer metal pattern 11b are divided into a plurality of patterns each being bonded to the LED element 14 by one corresponding flip chip connection layer 8, and these patterns are separated from each other. These measures alleviate the influence of the linear thermal expansion coefficient of the first metal layer 11 and therefore can exploit the properties of the polymer resin layer 10; as a result, when the LED module is subjected to a temperature cycle, stress in the LED module 14 as well as at the connection interface between the LED element 14 and wiring board 16 can be reduced.

Second Embodiment of the Invention

Figure 5:
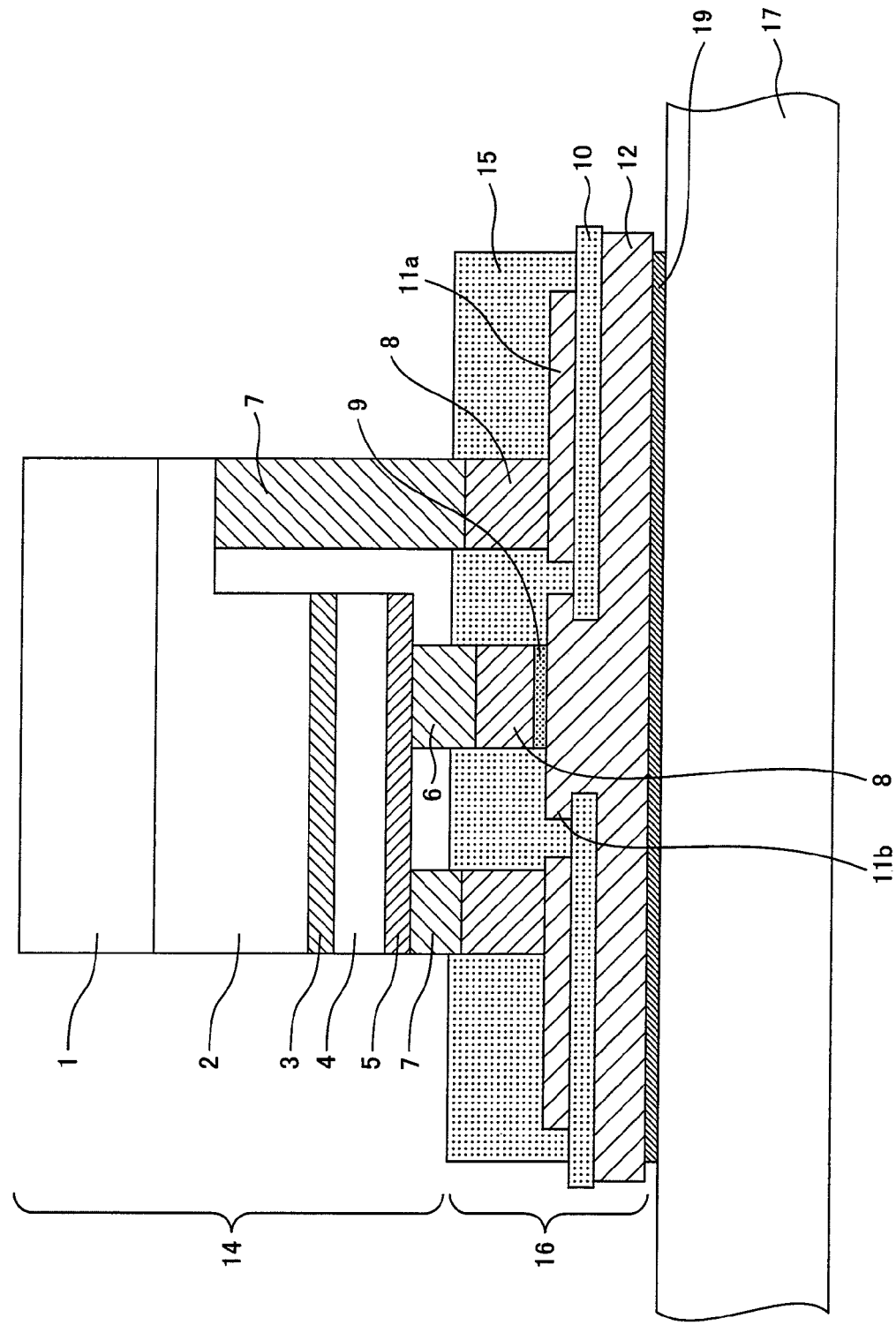
FIG. 5 is a schematic illustration showing a cross sectional view of an example of an LED module according to a second embodiment of the present invention.

FIG. 5 is a schematic illustration showing a cross sectional view of an example of an LED module according to a second embodiment of the present invention. As shown in FIG. 5, in order to enhance heat dissipation (heat radiation) efficiency of the LED element 14, a heat sink 17 as a heat dissipator is additionally provided to the LED module of FIG. 1. The heat sink 17 may be anything with a heat dissipating (heat radiation) function, e.g., an equipment casing. The heat sink 17 is bonded to the second metal layer 12 of the wiring board 16 by an adhesive layer 19. While the heat sink is preferably mounted with a heat conducting adhesive, it may also be forced against the wiring board by a clamping jig (not shown)

with a silicone grease applied therebetween. In this embodiment, the second metal layer 12 is an outer metal layer of the at least two metal layers.

Third Embodiment of the Invention

Figure 6:
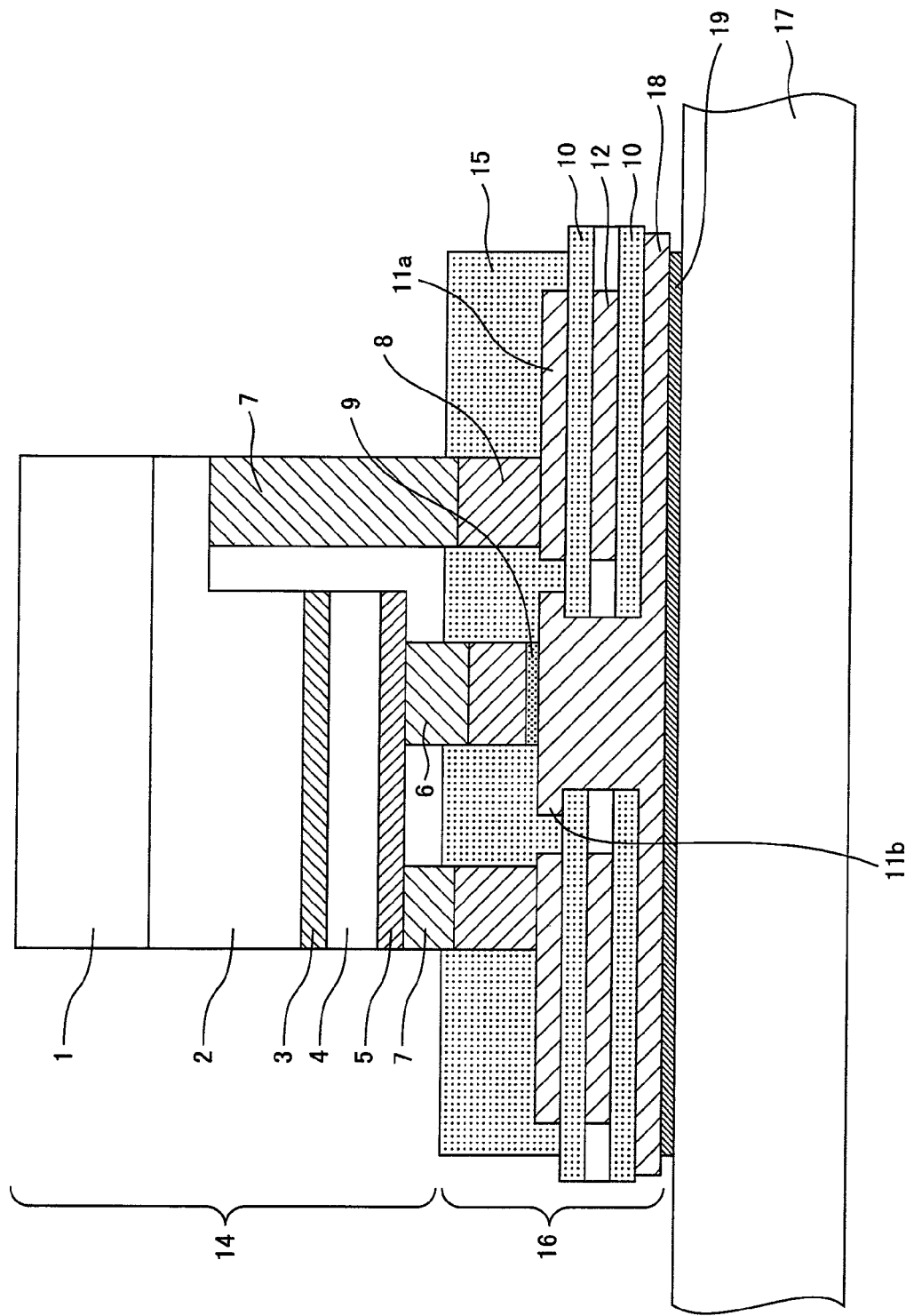
FIG. 6 is a schematic illustration showing a cross sectional view of an example of an LED module according to a third embodiment of the present invention.

FIG. 6 is a schematic illustration showing a cross sectional view of an example of an LED module according to a third embodiment of the present invention. In an LED module according to a third embodiment, the wiring board 16 has a three-stack structure, as shown in FIG. 6. That is, a third metal layer 18 is additionally provided on the second metal layer 12 through a medium of another polymer resin layer 10. In this embodiment, the third metal layer 18 is an outer metal layer of the at least two metal layers. When another heat transfer pattern insulated from the power supply pattern 11a can be formed in the second metal layer 12, heat dissipation efficiency can be enhanced by connecting the heat transfer pattern to the third metal layer 18 through a plated and filled via or the like.

Fourth Embodiment of the Invention

Figure 7:
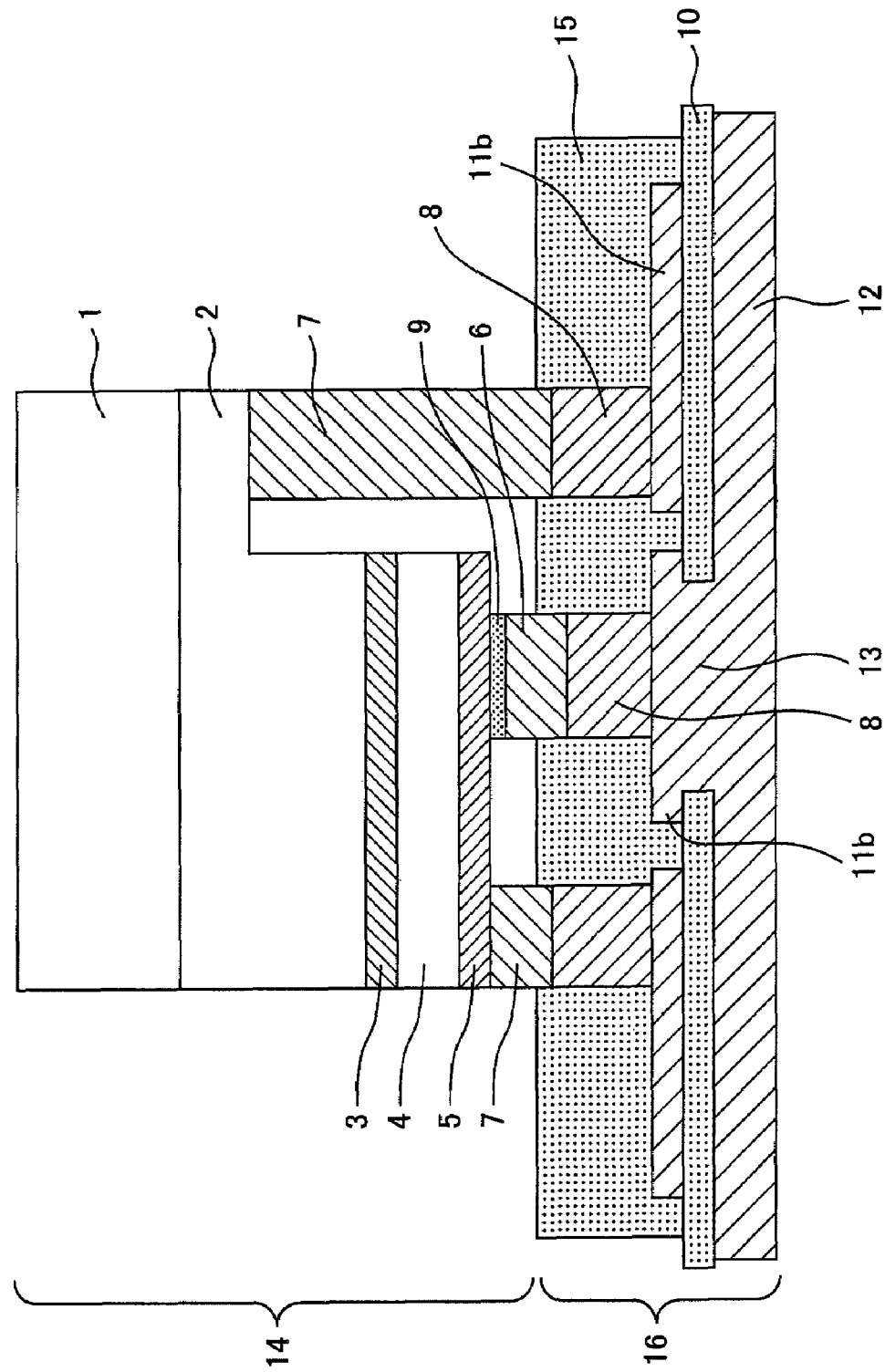
FIG. 7 is a schematic illustration showing a cross sectional view of an example of an LED module according to a fourth embodiment of the present invention.

FIG. 7 is a schematic illustration showing a cross sectional view of an example of an LED module according to a fourth embodiment. The fourth embodiment differs from the first embodiment in that the electrically insulating portion 9 is provided on the side of the LED element 14 instead of on the side of the wiring board 16. Namely, in the process of fabricating the LED element 14, on the metal film layer 5 is formed the electrically insulating portion 9, on which the heat transfer metal portion 6 is formed. An underlying layer for improving adhesiveness may be formed between the electrically insulating portion 9 and the metal film layer 5 and/or the heat transfer metal portion 6. The electrically insulating portion 9 is preferably an electrically insulating film such as $SiO_2$ and DLC.

The LED modules according to the above-described embodiments are applicable to a backlight of a small-size FPD for use in a cellular phone and the like, and are also applicable to a backlight of an LCD TV and the like, a lighting device, an illumination device, a signboard device, etc.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. An LED module, comprising:
an LED element having a metal film layer for conducting heat from the LED element; said LED element having a metal lead including a heat transfer metal portion, and having an electrode for flip chip mounting the LED element, and
a wiring board having at least two metal layers and an electrically insulating layer including a polymer resin and being interposed between each two of the at least two metal layers;
wherein a first metal layer of the at least two metal layers on the LED element mounted side of the wiring board has a power supply metal pattern and a heat transfer metal pattern formed electrically insulated from the power supply metal pattern;
wherein the power supply metal pattern and the electrode are flip chip connected to each other for enabling electrical conduction, the heat transfer metal pattern and the metal film layer are flip chip connected through an electrically insulating portion interposed therebetween, and the heat transfer metal pattern and the at least two metal layers other than the first metal layer are coupled to each other through a heat transfer portion; and
wherein the heat transfer metal pattern and the metal film layer are flip chip connected through both the heat transfer metal portion and an electrically insulating portion interposed between the heat transfer metal portion and the metal film layer.

2. The LED module according to claim 1, wherein:
the heat transfer metal portion is formed on the metal film layer.

3. The LED module according to claim 1, wherein:
a plurality of openings are formed in a resist covering the first metal layer; and
the electrode and the heat transfer metal portion are each flip chip connected through a corresponding one of the plurality of openings to the power supply metal pattern and the heat transfer metal pattern respectively.

4. The LED module according to claim 1, wherein:
the wiring board is a tape-shape or a sheet-shape; and the LED module comprises at least two LED elements that are disposed in width and/or length directions of the wiring board at a respective given spacing for each direction.

5. The LED module according to claim 1, wherein:
the heat transfer portion is formed of a material having a thermal conductivity of not less than 30 W/m·K.

6. The LED module according to claim 1, wherein:
the heat transfer portion is at least one plated and filled via.

7. The LED module according to claim 1, wherein:
the electrically insulating layer has a thickness within a range from 3 to 125 μm.

8. The LED module according to claim 1, wherein:
the polymer resin has a linear thermal expansion 10 coefficient of 0 to 6 ppm/° C. within a temperature range from −40 to +120° C.

9. The LED module according to claim 1, wherein:
the polymer resin has a storage modulus of not more than 100 MPa and not less than 1 MPa at 100° C. and 240° C. respectively (dynamic viscoelasticity measurement frequency: 1 Hz).

10. The LED module according to claim 1, wherein:
a heat dissipator is provided on an outer metal layer which is connected to the heat transfer metal pattern by the heat transfer portion, and is formed on the electrically insulating layer on the side opposite to the first metal layer.

11. The LED module according to claim 10, wherein:
the heat dissipator has a thermal conductivity of not less than 30 W/m·K.

12. The LED module according to claim 10, wherein:
the heat dissipator is made of a ceramic.

13. The LED module according to claim 1,
wherein at least one of the heat transfer metal portion is formed directly on the metal film layer and the electrically insulating portion is interposed between the metal film layer and the heat transfer metal portion.

* * * * *